(12) United States Patent
Arai et al.

(10) Patent No.: US 12,092,950 B2
(45) Date of Patent: Sep. 17, 2024

(54) CASE AND OPTICAL UNIT

(71) Applicant: NIDEC SANKYO CORPORATION, Nagano (JP)

(72) Inventors: Tsutomu Arai, Nagano (JP); Takeshi Sue, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 145 days.

(21) Appl. No.: 17/855,665

(22) Filed: Jun. 30, 2022

(65) Prior Publication Data
US 2023/0004066 A1   Jan. 5, 2023

(30) Foreign Application Priority Data
Jun. 30, 2021 (JP) ................... 2021-109100

(51) Int. Cl.
*G03B 5/06* (2021.01)
*H05K 1/18* (2006.01)

(52) U.S. Cl.
CPC ............... *G03B 5/06* (2013.01); *H05K 1/189* (2013.01); *G03B 2205/0069* (2013.01); *H05K 2201/10189* (2013.01)

(58) Field of Classification Search
None
See application file for complete search history.

(56) References Cited

U.S. PATENT DOCUMENTS

| | | | | |
|---|---|---|---|---|
| 6,299,469 | B1 * | 10/2001 | Glovatsky | F02M 35/10144 439/329 |
| 2002/0081894 | A1 * | 6/2002 | Fuerst | H01R 12/613 439/492 |
| 2016/0231641 | A1 * | 8/2016 | Minamisawa | G03B 5/06 |
| 2019/0137780 | A1 * | 5/2019 | Arai | H04N 23/687 |
| 2020/0257131 | A1 * | 8/2020 | Arai | G03B 5/06 |
| 2022/0019087 | A1 * | 1/2022 | Minamisawa | G02B 27/646 |

FOREIGN PATENT DOCUMENTS

| | | | | |
|---|---|---|---|---|
| CN | 213522066 U | * | 6/2021 | |
| JP | 202186066 A | | 6/2021 | |
| JP | 2022158798 A | * | 10/2022 | ............... G03B 5/00 |
| JP | 2023000994 A | * | 1/2023 | |

* cited by examiner

*Primary Examiner* — Rodney E Fuller
(74) *Attorney, Agent, or Firm* — HAUPTMAN HAM, LLP (57) ABSTRACT

A case includes a movable body to which an optical module having a first flexible wiring board is to be attached, a fixed body, and a second flexible wiring board with which the first flexible wiring board is to be connected. The movable body is swingably held by the fixed body, and the second flexible wiring board is structured to be resiliently bent easier than the first flexible wiring board.

7 Claims, 7 Drawing Sheets

CASE AND OPTICAL UNIT

CROSS REFERENCE TO RELATED APPLICATION

The present invention claims priority under 35 U.S.C. § 119 to Japanese Application No. 2021-109100 filed Jun. 30, 2021, the entire content of which is incorporated herein by reference.

TECHNICAL FIELD

At least an embodiment of the present invention may relate to a case and an optical unit.

BACKGROUND

Conventionally, various optical units including a movable body having an optical module and a case which swingably holds the movable body have been used. For example, Japanese Patent Laid-Open No. 2021-86066 (Patent Literature 1) discloses an optical unit which includes a movable body having a camera module and a fixed body swingably holding the movable body.

A case which swingably holds a movable body having an optical module is commonly structured and used in a state that the optical module is attached to the movable body. The optical module commonly includes an imaging element in addition to a lens, and a flexible wiring board which is electrically connected with the imaging element is commonly extended from the optical module. The flexible wiring board is used for swingably holding the movable body with respect to a fixed body.

In a conventional optical unit, in order to swing a movable body by a sufficient amount of swing with respect to a fixed body, a flexible wiring board which is structured in a specially customized shape is used. However, manufacturing of an optical module having a flexible wiring board in a specially customized structure and a dedicated case to which the optical module is attached requires time and labor and a high cost. Therefore, an optical module and a case at a low cost and high versatility are desired.

SUMMARY

In view of the problem described above, at least an embodiment of the present invention may advantageously provide a case and an optical unit in which a movable body to which an optical module is attached is swingably held by a fixed body, versatility of the case and the optical unit being enhanced and their costs being reduced.

According to at least an embodiment of the present invention, there may be provided a case including a movable body to which an optical module having a first flexible wiring board is to be attached, a fixed body, and a second flexible wiring board with which the first flexible wiring board is to be connected. The case swingably holds the movable body with respect to the fixed body, and the second flexible wiring board is structured to be resiliently bent easier than the first flexible wiring board.

According to this embodiment, the case includes a second flexible wiring board with which a first flexible wiring board of an optical module is to be connected. Therefore, the first flexible wiring board of the optical module is not required to form in a dedicated and complicated shape and thus, its versatility is enhanced and a cost can be reduced. Further, the second flexible wiring board is structured to be resiliently bent easier than the first flexible wiring board. Therefore, the movable body can be swingably held by the fixed body with a sufficient amount of swing.

In the case in accordance with an embodiment of the present invention, the second flexible wiring board is provided with a connector which is to be connected with the first flexible wiring board. According to this structure, the first flexible wiring board can be easily connected with the second flexible wiring board and thus, a highly versatile case can be obtained.

In the case in accordance with an embodiment of the present invention, the movable body is structured to be capable of swinging with respect to the fixed body with an axial line direction of the optical module as a swing axis. According to this structure, various optical modules which are capable of swinging with the axial line direction as a swing axis can be utilized.

In the case in accordance with an embodiment of the present invention, the movable body is capable of swinging with respect to the fixed body only with the axial line direction of the optical module as a swing axis. According to this structure, a thickness in the optical axis direction of the case can be reduced. Further, a structure of the case can be simplified and thus, a cost of the case can be reduced.

In the case in accordance with an embodiment of the present invention, the movable body is capable of swinging with respect to the fixed body, in addition to the swing axis in the axial line direction, with a direction intersecting the axial line direction as a swing axis. According to this structure, the optical module can be swung with respect to the case with a plurality of swing axes as references and thus, further various types of optical modules can be used.

In the case in accordance with an embodiment of the present invention, the second flexible wiring board is provided with a first extended part which is extended in a first direction and a second extended part which is extended in a second direction intersecting the first direction. According to this structure, the second flexible wiring board can be resiliently bent in various directions and the movable body can be swingably held with a sufficient amount of swing with respect to the fixed body.

An optical unit in accordance with an embodiment of the present invention includes the above-mentioned case and an optical module. According to this structure, versatility of respective structure members of the optical unit can be enhanced and a cost of the entire optical unit can be reduced.

EFFECTS OF THE INVENTION

The case in accordance with an embodiment of the present invention which swingably holds a movable body to which an optical module is to be attached with respect to the fixed body is capable of enhancing versatility and its cost can be reduced.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

An optical unit 1 and a case 100 which structures the optical unit 1 in accordance with an embodiment of the present invention will be described below with reference to FIGS. 1 through 7. In the respective views, a "Z"-axis direction is an optical axis direction, an "X"-axis direction is a direction intersecting the optical axis, in other words, an axial direction of yawing, and a "Y"-axis direction is a direction intersecting the optical axis, in other words, an axial direction of pitching.

<Schematic Entire Structure of Optical Unit>

Figure 1:
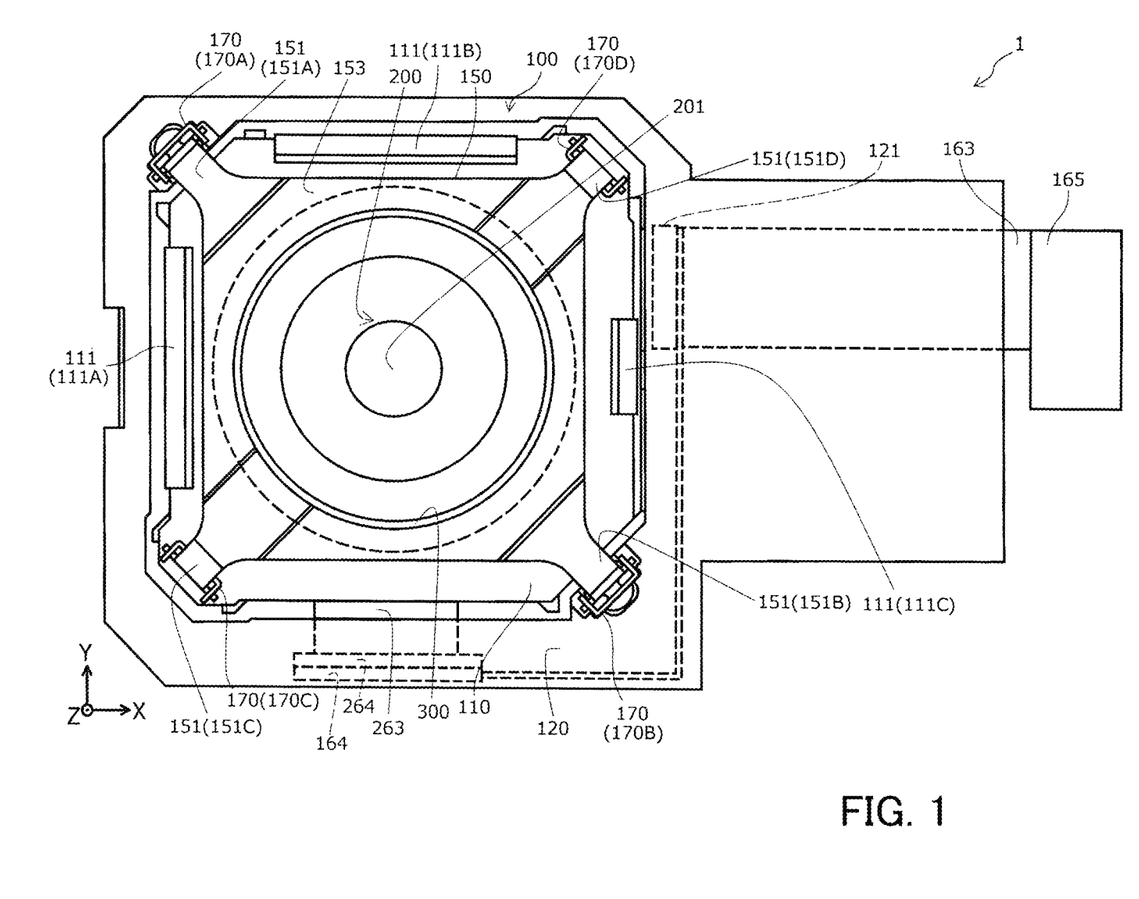
FIG. 1 is a plan view showing an optical unit in accordance with an embodiment of the present invention.

First, a schematic structure of an optical unit 1 in accordance with an embodiment of the present invention will be described below with reference to FIG. 1. As shown in FIG. 1, the optical unit 1 in accordance with this embodiment includes an optical module 200 and a case 100. The optical module 200 is a camera module including a lens 201, an imaging element not shown and the like. Further, the case 100 is provided with an accommodation frame 110 which swingably accommodates the optical module 200. The case 100 is structured so that the optical module 200 accommodated in the accommodation frame 110 is capable of being displaced in a direction (pitching direction) in which the "Y"-axis direction is a swing axis, a direction (yawing direction) in which the "X"-axis direction is a swing axis, and a direction (rolling direction) in which the "Z"-axis direction is a swing axis.

<Optical Module>

Figure 2:
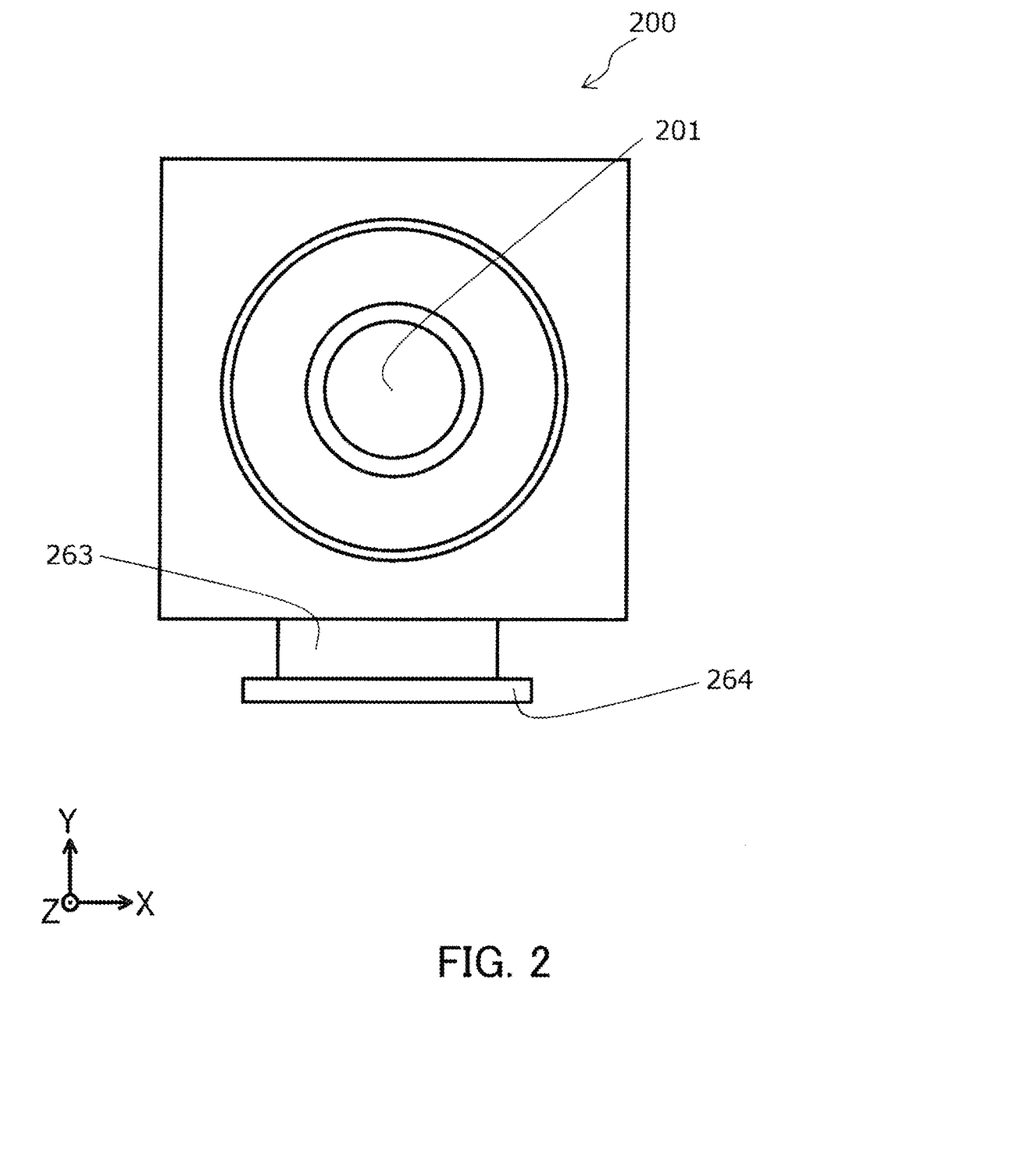
FIG. 2 is a plan view showing an optical module of an optical unit in accordance with an embodiment of the present invention.

Next, a schematic structure of the optical module 200 will be described below with reference to FIG. 2. In this embodiment, the optical module 200 is formed in a substantially rectangular housing shape when viewed in the "Z"-axis direction which corresponds to the optical axis direction. For example, the optical module 200 is used as a thin camera or the like which is mounted on a cellular phone with a camera, a tablet type PC or the like. The optical module 200 includes a lens 201 on the "+Z" direction side which is an object side, and an optical device for imaging is incorporated in an inside of a housing in a rectangular case shape. Further, the optical module 200 is connected with a first flexible wiring board 263 as an optical module side flexible wiring board whose tip end is connected with a connector 264.

The optical unit 1 in this embodiment is, as an example, incorporated with an actuator (drive mechanism) which is structured to correct a shake in the pitching direction (shake in a swing direction whose swing axis is the "Y"-axis direction) occurred in the optical module 200, a shake in the yawing direction (shake in a swing direction whose swing axis is the "X"-axis direction), and a shake in the rolling direction (shake in a swing direction whose swing axis is the "Z"-axis direction) and thereby, the optical unit 1 is capable of performing a shake correction in the pitching direction, a shake correction in the yawing direction, and a shake correction in the rolling direction. In this embodiment, the optical unit 1 is structured so as to be capable of performing a shake correction in the pitching direction, a shake correction in the yawing direction, and a shake correction in the rolling direction. However, the present invention is not limited to this structure and, for example, the present invention may be structured so that only one or two of shakes in the pitching direction, the yawing direction and the rolling direction can be corrected.

<Case>

Next, a structure of the case 100 which is a principal part of the optical unit 1 in accordance with this embodiment will be described below with reference to FIG. 1 and FIGS. 3 through 7. As shown in FIG. 1, the case 100 includes a fixed body 120. Further, the case 100 includes magnets 111 and coils 122 provided at positions facing the magnets 111 as a drive mechanism which is structured to drive the accommodation frame 110 that is a movable body in the pitching direction, the yawing direction and the rolling direction (see FIG. 3). In this embodiment, a magnet 111A of the magnets 111 corresponds to a drive mechanism in a direction in which a swing axis is the "Y"-axis direction (pitching direction), a magnet 111B corresponds to a drive mechanism in a direction in which a swing axis is the "X"-axis direction (yawing direction), and a magnet 111C corresponds to a drive mechanism in a direction in which a swing axis is the "Z"-axis direction (rolling direction). Further, as shown in FIG. 1, the case 100 is arranged with a gimbal mechanism 150 and support parts 170, which swingably support the accommodation frame 110 in the pitching direction and the yawing direction with respect to the fixed body 120, and a turning support mechanism 300 which swingably supports the accommodation frame 110 in the rolling direction with respect to the fixed body 120.

<Accommodation Frame>

Figure 3:
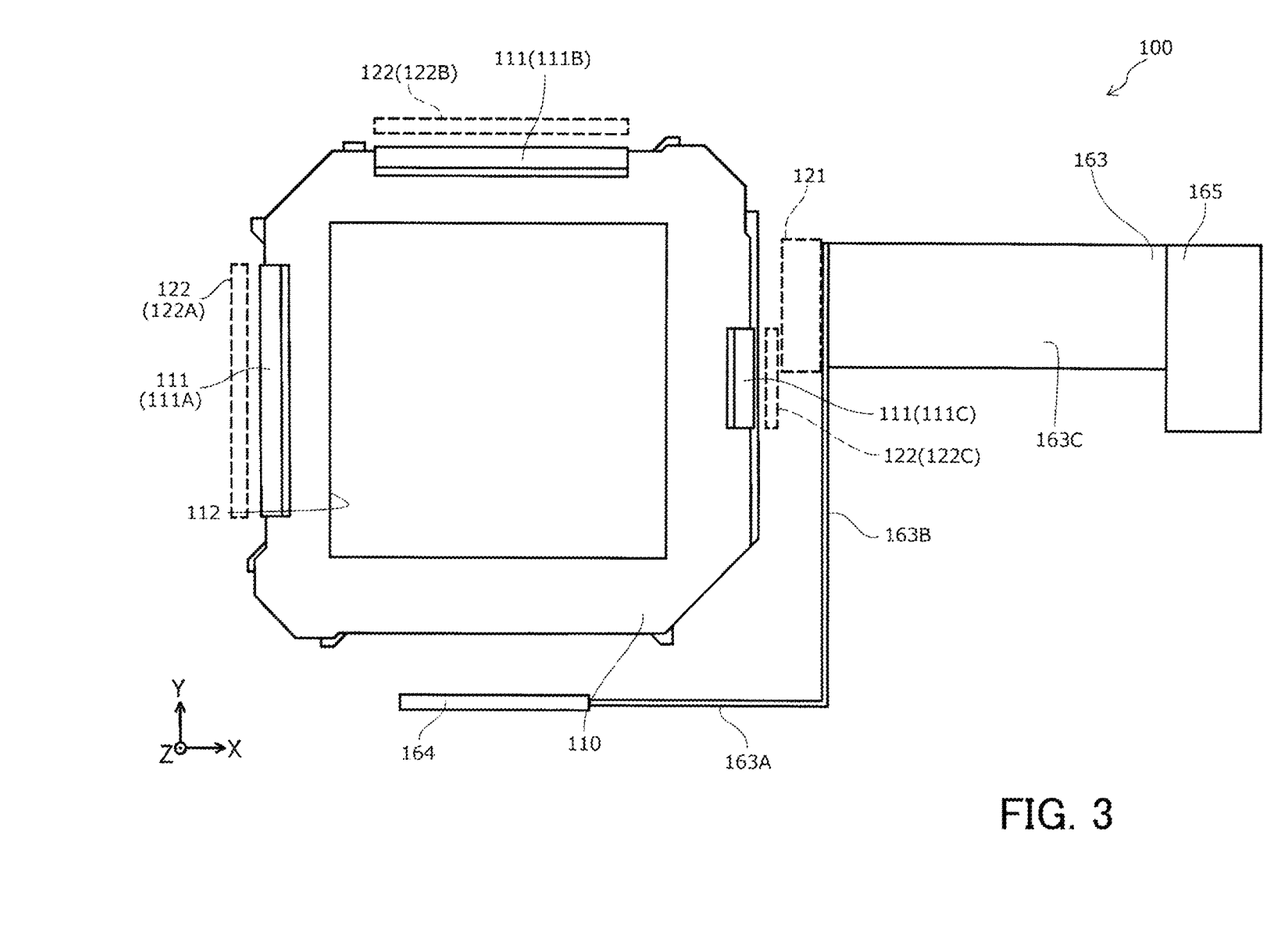
FIG. 3 is a plan view showing a case of an optical unit in accordance with an embodiment of the present invention in which a fixed body is not shown.

As shown in FIG. 3 and the like, the accommodation frame 110 is structured to be a rectangular frame-shaped member which surrounds four faces of the optical module 200 except a front face (face on an object side) where the lens 201 of the optical module 200 is provided and its rear face on an opposite side. The accommodation frame 110 in this embodiment is, as an example, structured so that the optical module 200 is capable of attaching to and detaching from the accommodation part 112. However, it may be structured that the optical module 200 and the accommodation frame 110 are integrated with each other. In this embodiment, the magnet 111A for pitching correction, the magnet 111B for yawing correction and the magnet 111C for rolling correction are attached to three outer faces of the accommodation frame 110 which face the fixed body 120.

<Fixed Body>

The fixed body 120 is attached with coils 122 (coil 122A, coil 122B and coil 122C) at a position facing the magnet 111A, a position facing the magnet 111B and a position facing the magnet 111C. Each of the coils 122 in this embodiment is a winding coil, but a pattern substrate (coil substrate) in which the coil 122 is integrated in a substrate as a pattern may be used. Further, as shown in FIG. 1, the fixed body 120 in this embodiment is structured of a rectangular frame-shaped member, which is provided so as to surround at least three faces of the accommodation frame 110 in a direction around the optical axis, and a member extended to an outer side along the "X"-axis direction.

In this embodiment, pitching, yawing and rolling corrections are performed as described below. When a shake in at least one of the pitching direction, the yawing direction and the roll direction occurs in the optical unit 1, the shake is detected by a Hall element not shown and an electric current is supplied to the coil 122 based on the result. In the optical unit 1 in this embodiment, the coil 122 is operated so as to correct a shake based on a detected result of the shake. In other words, an electric current is supplied to the respective coils 122 so as to move the accommodation frame 110 in a direction cancelling a shake of the optical unit 1 and thereby, the shake is corrected.

<Support Mechanism>

The case 100 in this embodiment includes, as a support mechanism which swingably supports the accommodation frame 110 in the yawing direction and the pitching direction with respect to the fixed body 120, a gimbal mechanism 150 and support parts 170 which connect the gimbal mechanism 150 with the fixed body 120 and connect the gimbal mechanism 150 with the accommodation frame 110. Further, in addition, in this embodiment, a turning support mechanism 300 which swingably supports the accommodation frame 110 in the rolling direction with respect to the fixed body 120 is arranged in an inside of the case 100. As the turning support mechanism 300, for example, a bearing mechanism may be used in which an upper side member in a circular ring shape is fixed to the gimbal mechanism 150, a lower side member in a circular ring shape is fixed to the accommodation frame 110 or the optical module 200, and the upper side member and the lower side member are relatively turnable around the optical axis by a plurality of spherical bodies arranged between the upper side member and the lower side member with a direction of the optical axis as a turning axis. However, the turning support mechanism 300 which swingably supports the accommodation frame 110 in the rolling direction with respect to the fixed body 120 is not limited to the bearing mechanism described above, and a structure or a mechanism which has been conventionally used may be utilized.

As shown in FIG. 1, the case 100 in this embodiment includes a support part 170A, a support part 170B, a support part 170C and a support part 170D as the support parts 170. The support part 170A and the support part 170B are disposed at two opposite positions in four corners of the rectangular frame-shaped member of the fixed body 120, and the support part 170C and the support part 170D are disposed at two opposite positions in four corners of the accommodation frame 110. In this embodiment, the rectangular frame-shaped member of the fixed body 120 and the accommodation frame 110 in a rectangular frame shape are disposed so that their positions of the four corners are aligned with each other, and the support part 170A, the support part 170B, the support part 170C and the support part 170D are disposed one by one at the four corners.

The gimbal mechanism 150 is a mechanism which is formed by bending a metal flat plate member and is provided with a spring property. Specifically, the gimbal mechanism 150 is, as an example, structured of a gimbal frame part 153 provided on an object side, and leg parts 151 which are formed by bending by 90° in the optical axis direction from four corner parts of the gimbal frame part 153. More specifically, the gimbal mechanism 150 is, as the leg parts 151, provided with a leg part 151A disposed at a position facing the support part 170A, a leg part 151B disposed at a position facing the support part 170B, a leg part 151C disposed at a position facing the support part 170C, and a leg part 151D disposed at a position facing the support part 170D. Each of the leg parts 151 is supported by each of the facing support parts 170. In this embodiment, each of the leg parts 151 is not required to be formed so that the entire leg part is formed in a plate shape, but only a part of the leg part is formed in a plate shape to provide a spring property.

<Drive Mechanism>

As described above, the case 100 in this embodiment includes the magnet 111 and the coil 122 as the drive mechanism. Further, the magnet 111A, the magnet 111B and the magnet 111C are provided as the magnets 111, and the coils 122 are respectively disposed at a position facing the magnet 111A, a position facing the magnet 111B, and a position facing the magnet 111C. Specifically, as shown in FIG. 3, the coil 122A is disposed at a position facing the magnet 111A, the coil 122B is disposed at a position facing the magnet 111B, and the coil 122C is disposed at a position facing the magnet 111C.

<Case Side Flexible Wiring Board>

As shown in FIG. 1, the fixed body 120 in this embodiment is structured so that the rectangular frame-shaped member is formed to be wide on the "−Y" direction side and the "+X" direction side. In other words, in the fixed body 120 in this embodiment, a space between a wall part on an outer side of the rectangular frame-shaped member and the accommodation frame 110 is set to be wide on the "−Y" direction side and the "+X" direction side. Further, as shown in FIG. 1, a second flexible wiring board 163 which is a case side flexible wiring board is disposed at a position corresponding to the spaces between the wall parts on the "−Y" direction side and the "+X" direction side on an outer side of the rectangular frame-shaped member and the accommodation frame 110.

Figure 6:
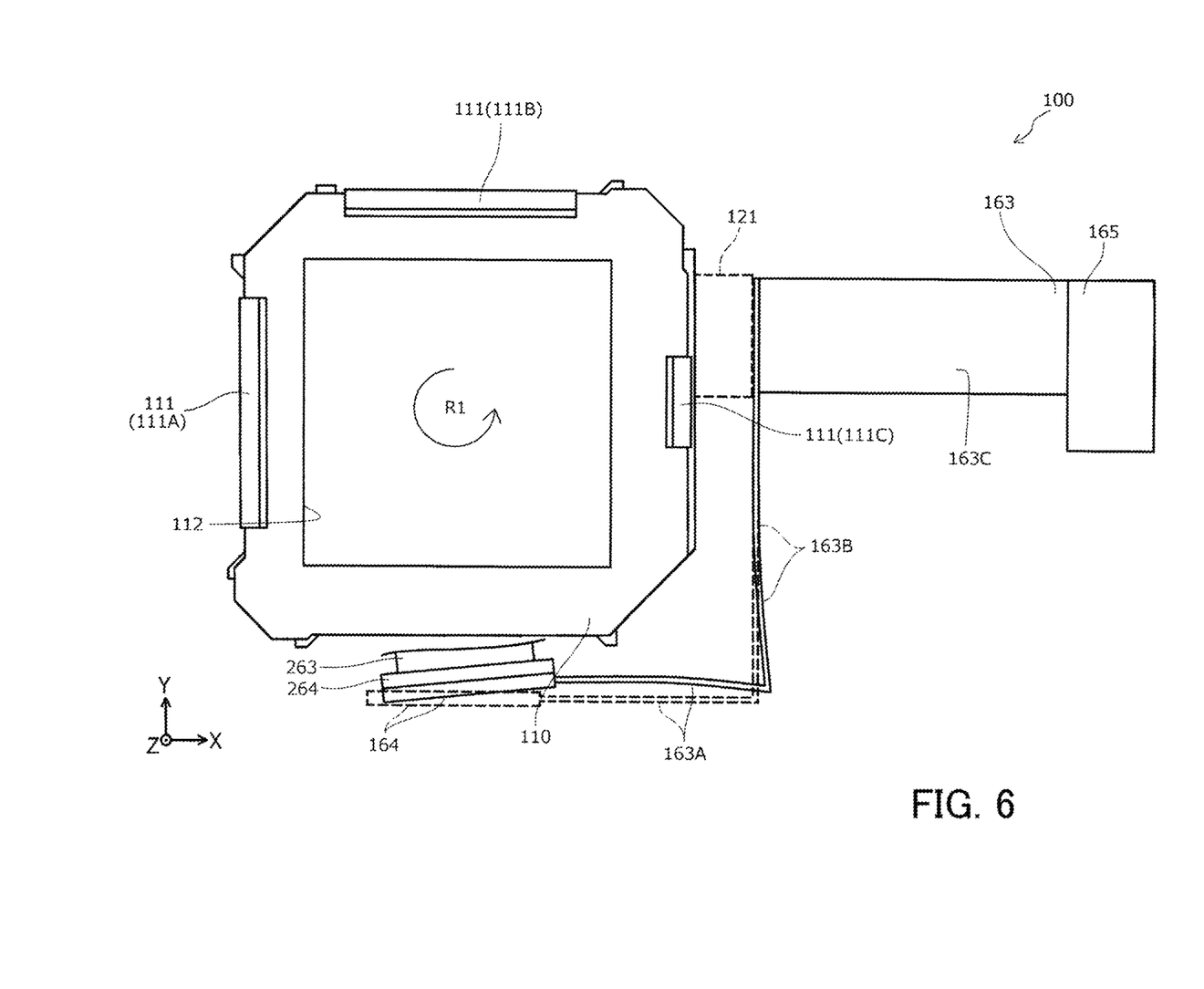
FIG. 6 is a plan view showing a state of a second flexible wiring board when a movable body is swung in a rolling direction "R1" with respect to a fixed body in an optical unit in accordance with an embodiment of the present invention.
Figure 7:
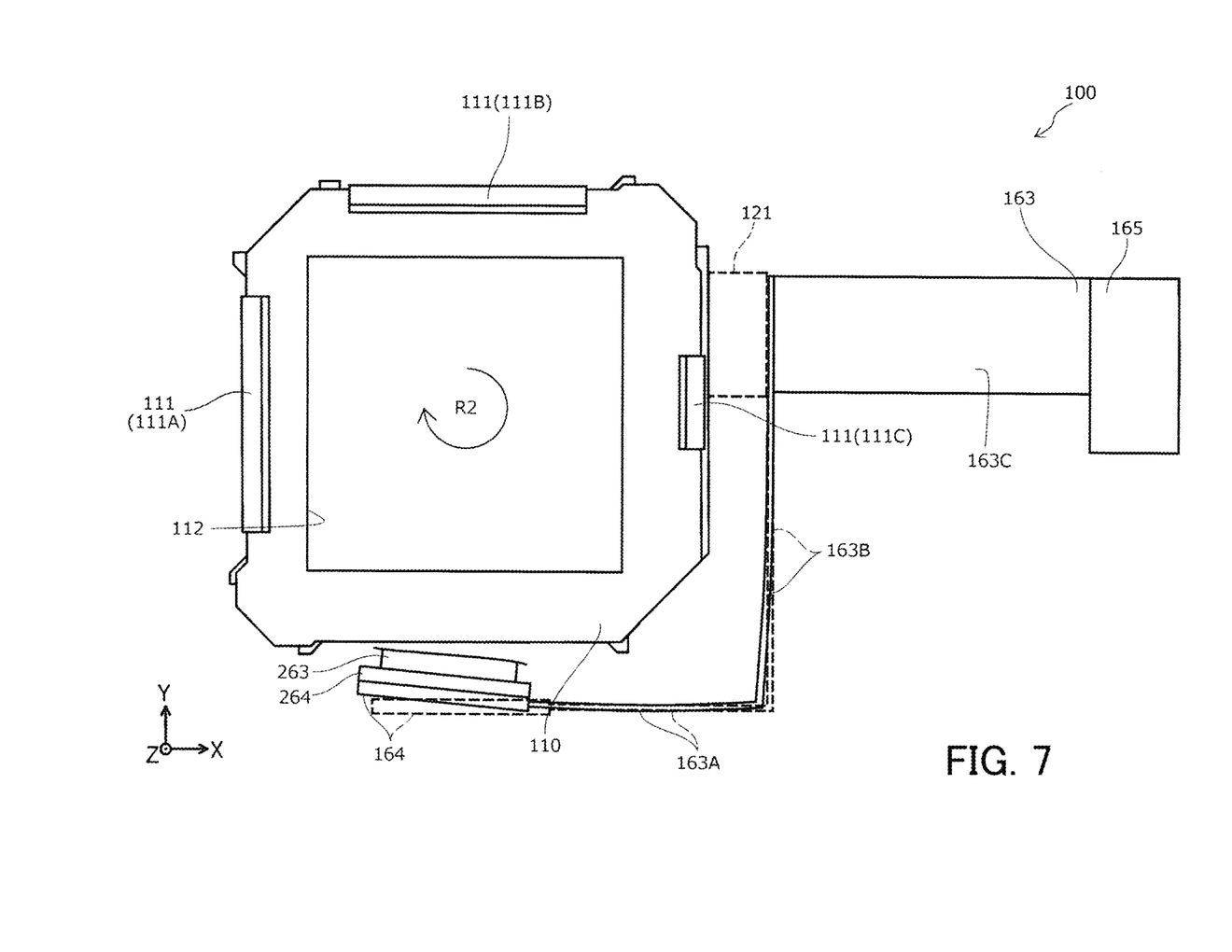
FIG. 7 is a plan view showing a state of a second flexible wiring board when a movable body is swung in a rolling direction "R2" with respect to a fixed body in an optical unit in accordance with an embodiment of the present invention.

The second flexible wiring board 163 is, as shown in FIGS. 6 and 7, connected with a connector 164 capable of connecting with the connector 264 which is connected with the first flexible wiring board 263, at an end part on one side. Further, the second flexible wiring board 163 is connected with a connector 165, which is capable of connecting with an external device, at an end part on an opposite side to a side where the connector 164 is connected.

As shown in FIG. 3 and the like, the second flexible wiring board 163 is provided with a first extended part 163A which is connected with the connector 164 and is extended in the "X"-axis direction, a second extended part 163B which is bent at a substantially right angle with respect to the first extended part 163A and is extended in the "Y"-axis direction, and a third extended part 163C which is bent at a substantially right angle with respect to the second extended part 163B and is extended in the "X"-axis direction and connected with the connector 165. The first extended part 163A is disposed so as to face a face on the "−Y" direction side of the accommodation frame 110, the second extended part 163B is disposed so as to face a face on the "+X" direction side of the accommodation frame 110, and the third extended part 163C is disposed so as to direct to the "Z"-axis direction side. Further, as shown in FIG. 3, an end part side on the "+Y" direction side of the second extended part 163B is fixed to a fixing part 121 which is formed in the fixed body 120.

Figure 4:
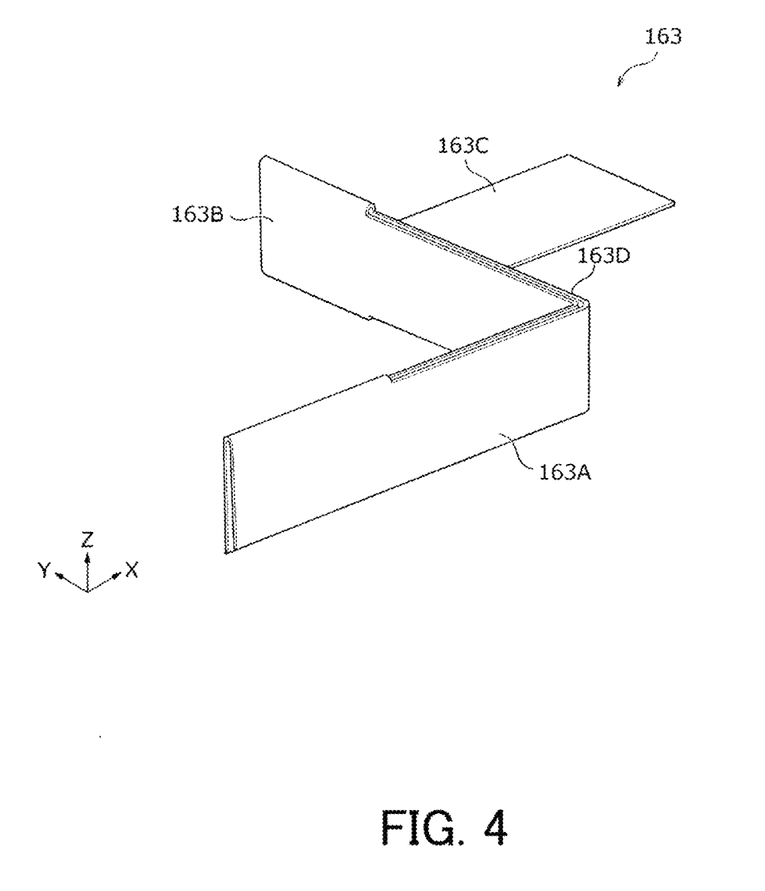
FIG. 4 is a perspective view showing a second flexible wiring board in a case of an optical unit in accordance with an embodiment of the present invention.
Figure 5:
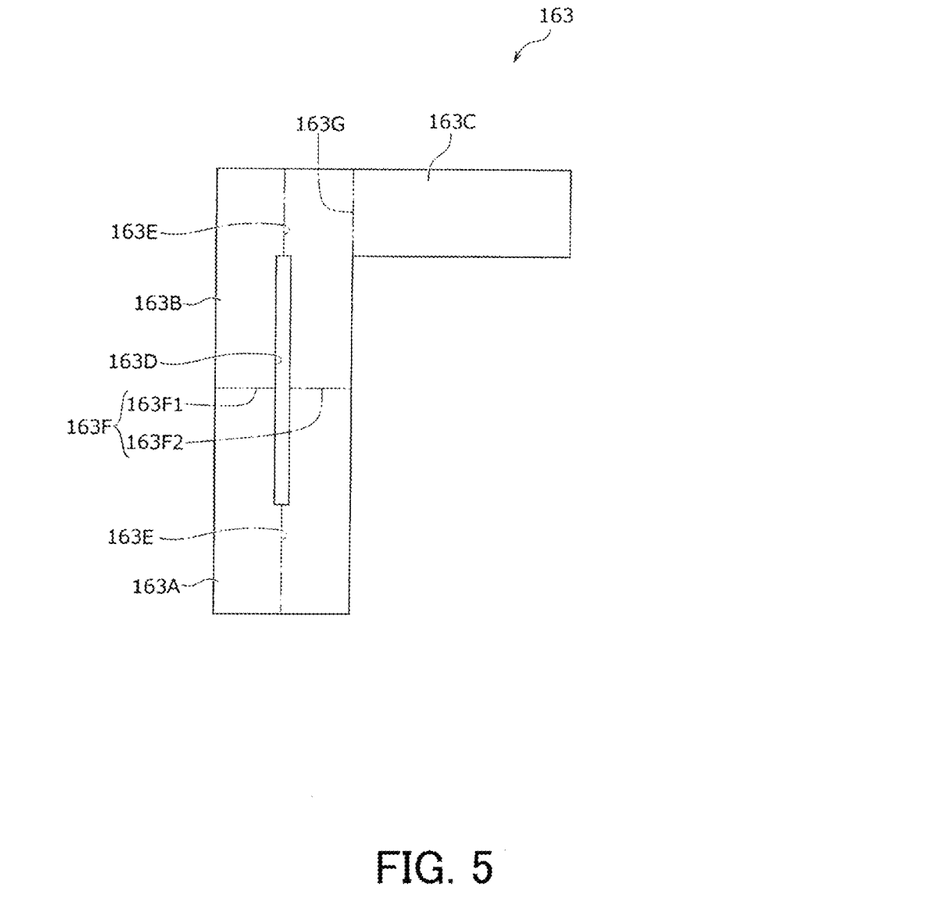
FIG. 5 is a developed view showing a second flexible wiring board in a case of an optical unit in accordance with an embodiment of the present invention.

The second flexible wiring board 163 is formed in a shape as shown in FIG. 4 by bending a flexible wiring board in a substantially "L"-shape which is shown in a developed view in FIG. 5. Specifically, the second flexible wiring board 163 is bent by 180° and crest-folded along a bending line 163E from a state shown in the developed view in FIG. 5 and, next, the second flexible wiring board 163 is bent by 90° and valley-folded along a bending line 163G and, finally, the second flexible wiring board 163 is bent by 90° along a bending line 163F. In this embodiment, when the second flexible wiring board 163 is bent along the bending line 163F, the bending line 163F1 is valley-folded and the bending line 163F2 is crest-folded.

The second flexible wiring board 163 which is formed as described above is, as shown in FIG. 4, structured so that the first extended part 163A and the second extended part 163B are formed in a two-layer structure, and the third extended part 163C is formed in a one-layer structure. In this embodiment, the second flexible wiring board 163 is, as shown in FIG. 4, provided with a cut-out part 163D in a region from the first extended part 163A to the second extended part 163B at an end part on the "+Z" direction side. However, the second flexible wiring board 163 may be provided with no cut-out part 163D. Further, the second flexible wiring board 163 in this embodiment is structured thinner than the first flexible wiring board 263 and is structured so as to be easily bent resiliently in comparison with the first flexible wiring board 263.

The second flexible wiring board 163 in this embodiment is structured as described above. Therefore, for example, as shown in FIG. 6, even in a case that the accommodation frame 110 to which the optical module 200 is to be attached is swung in a swing direction "R1" of rolling with respect to the fixed body 120, the first extended part 163A and the second extended part 163B are resiliently bent and thus, a large load is not applied to the connector 164, the connector 264, the accommodation frame 110 and the fixed body 120. Further, for example, as shown in FIG. 7, even in a case that the accommodation frame 110 to which the optical module 200 is to be attached is swung in a swing direction "R2" of rolling with respect to the fixed body 120, the first extended part 163A and the second extended part 163B are resiliently bent and thus, a large load is not applied to the connector 164, the connector 264, the accommodation frame 110 and the fixed body 120. In addition, even in a case that the accommodation frame 110 to which the optical module 200 is to be attached is swung in a swing direction of yawing and in a swing direction of pitching with respect to the fixed body 120, the first extended part 163A and the second extended part 163B are resiliently bent and thus, a large load is not applied to the connector 164, the connector 264, the accommodation frame 110 and the fixed body 120.

As described above, the case 100 in this embodiment includes the accommodation frame 110 to which the optical module 200 having the first flexible wiring board 263 is to be attached and the fixed body 120, and the case 100 swingably holds the accommodation frame 110 with respect to the fixed body 120. Further, the case 100 in this embodiment includes the second flexible wiring board 163 with which the first flexible wiring board 263 is to be connected. Further, the second flexible wiring board 163 is structured to be resiliently bent easier than the first flexible wiring board 263.

As described above, the case 100 in this embodiment is provided with the second flexible wiring board 163 with which the first flexible wiring board 263 of the optical module 200 is to be connected. Therefore, the first flexible wiring board 263 of the optical module 200 is not required to form in a dedicated complicated shape and thus, versatility is enhanced and a cost can be reduced. Further, in the case 100 in this embodiment, the second flexible wiring board 163 is structured to be more easily resiliently bent than the first flexible wiring board 263. Therefore, the accommodation frame 110 which is a movable body can be swingably held by the fixed body 120 with a sufficient amount of swing.

In accordance with an embodiment of the present invention, the first flexible wiring board 263 may be provided with no spring property. According to this structure, the first flexible wiring board 263 can be made in a high rigidity structure and thus, the optical module 200 is easily prevented from being damaged.

Further, in the case 100 in this embodiment, the second flexible wiring board 163 is connected with the connector 164, and the first flexible wiring board 263 is connected with the connector 264 which is capable of connecting with the connector 164. In other words, in the case 100 in this embodiment, the second flexible wiring board 163 is provided with the connector 164 with which the first flexible wiring board 263 is to be connected.

The case 100 in this embodiment is structured as described above. Therefore, the first flexible wiring board 263 can be easily connected with the second flexible wiring board 163 and thus, a highly versatile case can be obtained. In this embodiment, the phrase "provided with the connector 164 with which the first flexible wiring board 263 is to be connected" means, as described in this embodiment, including a connector for connecting the first flexible wiring board 263 through another member, for example, through another connector 264 different from the connector 164.

Further, as shown in FIGS. 6 and 7, the case 100 in this embodiment is structured so that the accommodation frame 110 is capable of swinging in the rolling direction with respect to the fixed body 120 with an axial line direction ("Z"-axis direction) of the optical module 200 as a swing axis. The case 100 in this embodiment is structured as described above and thus, the case 100 may be utilized in various optical modules 200 which are capable of swinging with an axial line direction as a swing axis.

In the case 100 in this embodiment, the accommodation frame 110 is capable of swinging with respect to the fixed body 120 in the yawing direction and the pitching direction in addition to the rolling direction. In other words, the case 100 in this embodiment is structured to provide with swing axes in the "X"-axis direction and the "Y"-axis direction which are directions intersecting the axial line direction ("Z"-axis direction) in addition to the swing axis in the axial line direction. The case 100 in this embodiment is structured as described above and thus, the optical module 200 can be swung with respect to the case 100 with a plurality of swing axes as references. Therefore, further various types of optical modules 200 can be used.

The present invention is not limited to the above-mentioned structure. For example, the case 100 may be structured so as to have only a swing axis in the axial line direction (in the rolling direction). According to this structure, for example, the case 100 may be structured so as not to have the gimbal mechanism 150 and thus, a thickness in the optical axis direction of the case 100 can be reduced. Further, since the structure of the case 100 can be further simplified and thus, a cost of the case 100 can be reduced.

Further, as shown in FIG. 3, the second flexible wiring board 163 is structured so as to have the first extended part 163A extended in the "X"-axis direction which is a first direction and the second extended part 163B extended in the "Y"-axis direction which is a second direction intersecting the first direction. The case 100 in this embodiment is structured as described above and thus, the second flexible wiring board 163 can be resiliently bent in various directions and the accommodation frame 110 can be swingably held with a sufficient amount of swing with respect to the fixed body 120. In this embodiment, the extended directions of the first extended part 163A and the second extended part 163B are shifted by substantially 90° from each other. However, the present invention is not limited to this structure, and the extended directions of the first extended part 163A and the second extended part 163B may be shifted by less than 90° or more than 90°.

In the present invention, the optical unit 1 in this embodiment is structured so as to have the case 100 and the optical module 200. The optical unit 1 in this embodiment is structured as described above and thus, versatility of respective structure members of the optical unit 1 can be enhanced and a cost of the entire optical unit 1 can be reduced.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A case comprising:
    a movable body to which an optical module having a first flexible wiring board is to be attached;
    a fixed body; and
    a second flexible wiring board with which the first flexible wiring board is to be connected;
    wherein the movable body is swingably held by the fixed body; and
    the second flexible wiring board is structured to be resiliently bent easier than the first flexible wiring board,
    the second flexible wiring board comprises a first extended part which extends vertically along a first direction and a second extended part which extends vertically along a second direction intersecting the first direction at a 90 degree angle, and
    the first vertical extended part connects to a connector which joints the first flexible wiring board to the second flexible wiring board, and the connector is oriented in a vertical direction.

2. The case according to claim 1, wherein the second flexible wiring board comprises a connector which is to be connected with the first flexible wiring board.

3. The case according to claim 1, wherein the movable body is capable of swinging with respect to the fixed body with an axial line direction of the optical module as a swing axis.

4. The case according to claim 3, wherein the movable body is capable of swinging with respect to the fixed body only with the axial line direction of the optical module as a swing axis.

5. The case according to claim 3, wherein the movable body is capable of swinging with respect to the fixed body, in addition to the swing axis in the axial line direction, with a direction intersecting the axial line direction as a swing axis.

6. The case according to claim 1, wherein the second flexible wiring board comprises a first extended part which is extended in a first direction and a second extended part which is extended in a second direction intersecting the first direction.

7. An optical unit comprising:
    the case defined in claim 1; and
    an optical module.

* * * * *